United States Patent [19]
Takemura et al.

[11] Patent Number: 5,814,540
[45] Date of Patent: Sep. 29, 1998

[54] METHOD FOR PRODUCING A TRANSISTOR

[75] Inventors: Yasuhiko Takemura; Toru Takayama, both of Kanagawa, Japan

[73] Assignee: Semiconductor Energy Laboratory Co., Ltd., Kanagawa, Japan

[21] Appl. No.: 785,485

[22] Filed: Jan. 17, 1997

Related U.S. Application Data

[60] Continuation of Ser. No. 462,740, Jun. 5, 1995, abandoned, which is a division of Ser. No. 205,111, Mar. 3, 1994, abandoned.

[30] Foreign Application Priority Data

Mar. 5, 1993 [JP] Japan .................................. 5-071105

[51] Int. Cl.⁶ .................................................. H01L 21/84
[52] U.S. Cl. ................................... 438/166; 438/486
[58] Field of Search ................................. 438/166, 486, 438/149, 163; 148/DIG. 150

[56] References Cited

U.S. PATENT DOCUMENTS

| | | | |
|---|---|---|---|
| 5,147,826 | 9/1992 | Liu | 437/233 |
| 5,236,850 | 8/1993 | Zhang | 437/21 |
| 5,275,851 | 1/1994 | Fonash et al. | 437/233 |
| 5,289,030 | 2/1994 | Yamazaki | 257/410 |
| 5,313,075 | 5/1994 | Zhang | 257/57 |
| 5,403,772 | 4/1995 | Zhang | 437/233 |

OTHER PUBLICATIONS

Kawazu, "Low Temperature Crystallization of Hydrogenated Amorphous Silicon Induced by Nickel Silicide Formation" *J. Journ. Appl. Physics* (Dec. 1990) p. 2698.

Hayzelden, *Applied Physics Letters* v60, #2, (1992) pp. 225–227.

A. V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

*Primary Examiner*—Michael Trinh
*Attorney, Agent, or Firm*—Sixbey, Friedman, Leedom & Ferguson, P.C.; Gerald J. Ferguson, Jr.; Eric J. Robinson

[57] ABSTRACT

In a thin film transistor, the reliability, yield and characteristics are improved by preventing the wire breaking of gate electrodes and wirings and the breakdown of a gate insulating film. Materials having at least one element of nickel, iron, cobalt and platinum are selectively formed closely on or beneath an amorphous silicon thin film formed on a substrate, and the materials are selectively crystallized, and the crystallized regions thus obtained are used as a channel forming region and impurity regions of a thin film transistor, and further an isolation between the thin film transistors is performed by the uncrystallized region.

5 Claims, 4 Drawing Sheets

METHOD FOR PRODUCING A TRANSISTOR

This application is a Continuation of Ser. No. 08/462,740 filed Jun. 5, 1995; now abandoned; which itself is a divisional of Ser. No. 08/205,111, filed Mar. 3, 1994.

BACKGROUND OF THE INVENTION

The present invention relates to a structure of a thin film transistor (TFT) and a method for producing the same. The thin film transistor manufactured by the present invention is formed either on an insulating substrate such as glass or a semiconductor substrate such as single crystal silicon.

A thin film transistor has conventionally been provided in such a manner that a thin film semiconductor region (active layer) is patterned to form in an insular shape, thereafter an insulating film is formed as a gate insulating film by a CVD method or a sputtering method and a gate electrode is formed on the insulating film.

The insulating film formed by the CVD method or the sputtering method has resulted in an insufficient step coverage and has adversely affected the reliability, yield and characteristics. FIGS. 4(A), 4(B) and 4(C) are an illustration of a conventional typical TFT as seen from above and sectional views taken along the lines IVB—IVB and IVC—IVC of FIG. 4(A), respectively. The TFT is formed on a substrate 51, and a thin film semiconductor region is located below impurity regions 53 (source and drain regions, where these show an N-type conductive region) and a gate electrode 57, and is substantially separated by an intrinsic channel forming region 52, and a gate insulating film 55 is formed so as to cover the semiconductor region. A contact hole is opened in the impurity regions 53 through an interlayer insulator 59, and electrodes and wirings 58 are provided.

As is apparent from the drawing, the covering properties on the end part of the semiconductor region of the gate insulating film 55 are remarkably poor and the end part is typically half the flat part in thickness. Generally, when an insular semiconductor region is thick, this phenomenon is remarkable. Particularly, the IVB—IVB section taken along the gate electrode shows that such worse covering properties adversely affect the characteristics, reliability and yield of the TFT. Particularly with respect to a region 56 indicated by dotted circle in the sectional view (FIG. 4(B)) taken along the line IVB—IVB of FIG. 4(A), an electric field of the gate electrode 57 is applied to and concentrated on the end part of the thin film semiconductor region. That is, since the end part of the gate insulating film is half of the flat part in thickness, the electric field strength of the end part becomes two times larger than that of the flat part.

As a result, the gate insulating film in the region 56 is easily broken down by applying a high voltage and/or a voltage for a long period of time. When a signal applied to the gate electrode is positive, the gate electrode 57 and the impurity regions 53 (particularly, drain regions) are in contact with each other since the semiconductor in the region 56 is an N-type, resulting in the deterioration in the reliability.

Also, where the gate insulating film is broken down, some electric charges are trapped. For example, when negative charges are trapped, almost regardless of the voltage applied to the gate electrode, the semiconductor in the region 56 becomes an N-type and the two impurity regions 53 are in contact together and the characteristics are deteriorated. Also, where the TFT is used without generating such deterioration, only half a voltage can be applied and the performance cannot be sufficiently utilized.

Further, the presence of such a weak part of the TFT easily results in the breakdown of the TFT by electrification or the like in a manufacturing process and leads to a primary factor to decrease the yield. Accordingly, it is an object of the present invention to solve such problems.

SUMMARY OF THE INVENTION

The present invention is characterized in that the insulation between the TFTs is maintained by electrical characteristics due to the difference of crystallizability in a semiconductor thin film using the planar semiconductor thin film, while a conventional TFT has a structure spatially insulated from other TFTs using an insular semiconductor. The present invention is also characterized in that a thin film semiconductor extends to a part outside the TFT formed on a substrate. In the present invention, the substantially amorphous thin film semiconductor region, impurity regions having a doping impurity and a substantially intrinsic channel forming region are in the same plane and are located below a gate electrode, and a gate insulating film is formed so as to cover these thin film semiconductor regions. While these thin film semiconductor regions are in the same plane, of course, the semiconductor regions are different in crystallizability and conductive type, respectively. Further, a contact hole is opened in the impurity regions through an interlayer insulator, and electrodes and wirings are provided therefor.

Since the present invention has an insular semiconductor region as stated above, the step coverage on the gate insulating film and the gate electrode does not raise any problem. Therefore, any problem inherent in a conventional structure can be solved. That is, the present invention is free from the decrease in yield due to the breakdown of wirings and the deterioration in characteristics to further improve the reliability.

The present invention requires that the crystallizability of semiconductor films on the same substrate is selectively controlled. Studies made by the present inventor have shown that an element of nickel (Ni), iron (Fe), cobalt (Co) or platinum (Pt), or silicide compounds with these elements have an action accelerating the crystallization as a catalyst in a semiconductor such as amorphous silicon. The crystallization temperature (under normal pressure, 400° to 580° C.) in this case was 20° to 200° C. lower than that of a conventionally general amorphous silicon (typically, 600° C.). Because of this, in a part where such catalyst material is not presented, the crystallization did not proceed and remained in a substantially amorphous state. In the crystallized part, a large carrier mobility was shown. In the part where the catalyst material is not presented (part of amorphous state), however, the resistance was large and thus an isolation between the TFTs could be obtained.

In the present invention, materials such as film, particle and cluster containing at least one element of nickel, iron, cobalt and platinum are selectively formed in regions such as a source region, a drain region and a channel forming region of the TFT required for high field effect mobility and low resistance with the materials placed closely on or beneath an amorphous silicon film, or ions of these elements are accelerated under a high voltage and are implanted into the amorphous silicon film, and then the amorphous silicon film is crystallized at the appropriate temperature lower than the crystallization temperature of the general amorphous silicon. A good result was obtained as the difference between the amorphous silicon according to the present invention and the general amorphous silicon in crystallization temperature was larger.

Since the above catalyst materials are not good for a silicon, it is desired that the concentration of the materials be lowered as much as possible. The studies made by the present inventor have shown that the presence of the concentration of at least 0.005 at. % or more results in the remarkable crystallization action and on the contrary, the presence of the concentration of 1 at. % or more adversely affects the semiconductor characteristics. Thus, the total of the concentration of these catalyst materials is preferably less than 1 at. %. Concerning the nickel, also, since the extra nickel is precipitated on the surface as a nickel silicide, the nickel silicide is dissolved with hydrofluoric acid or hydrochloric acid and thereby the concentration in the film can be reduced. Further, by a heat treatment of 580° C. or lower in gases containing chlorine atoms or a plasma treatment, the concentration of the nickel can be decreased similarly.

BRIEF DESCRIPTION OF THE DRAWINGS

The above and other objects of the invention will be seen by reference to the description taken in connection with the accompanying drawings, in which.

DESCRIPTION OF THE PREFERRED EMBODIMENTS

The present invention will now be described in more detail.

Embodiment 1

Figure 1A:
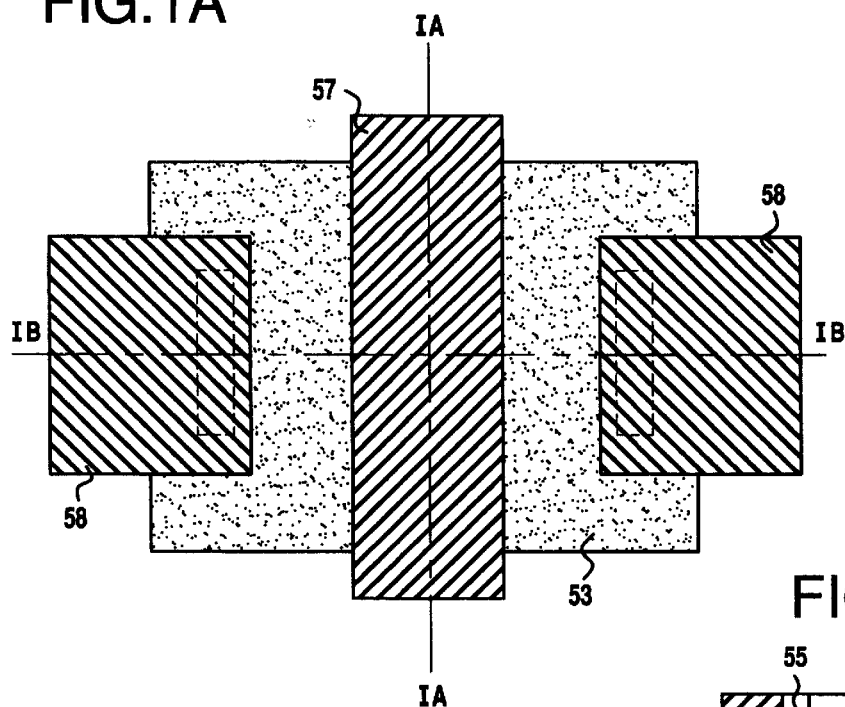
FIGS. 1(A), 1(B) and 1(C) are illustrations of a TFT according to the present invention.
Figure 1B:
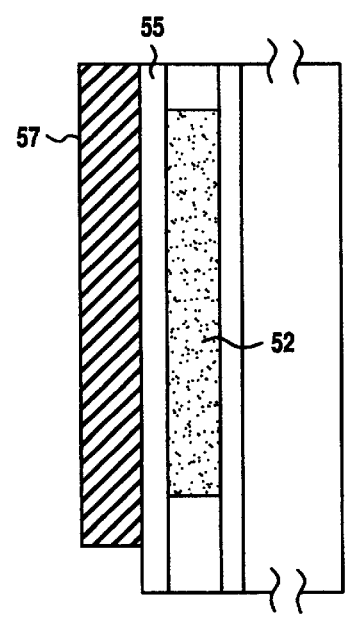
Figure 1C:
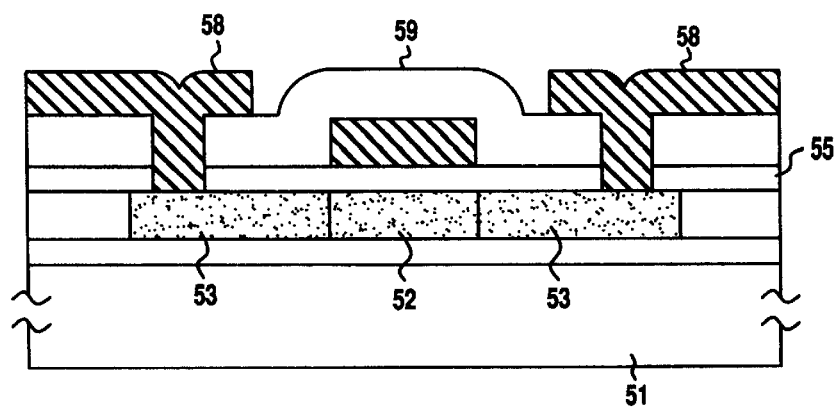
Figure 4A:
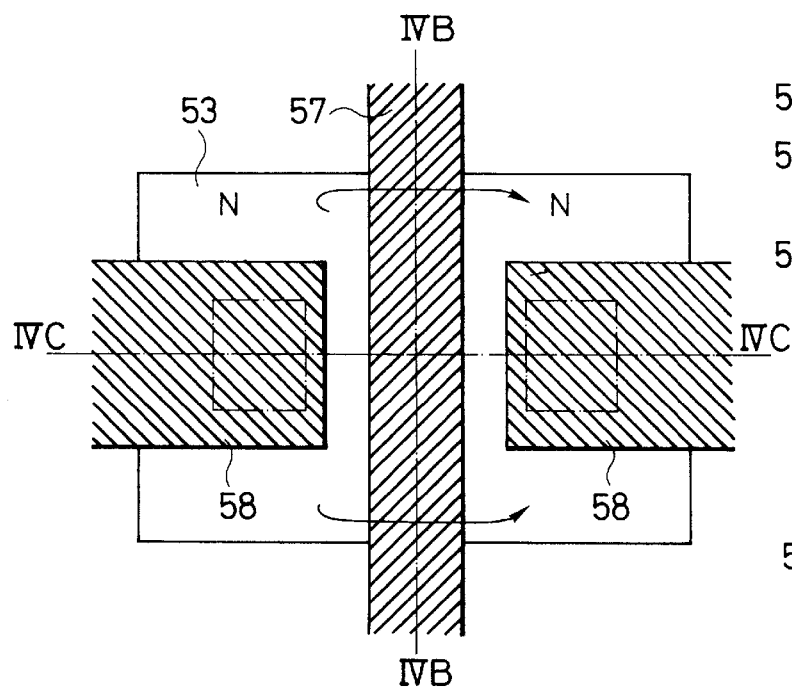
FIGS. 4(A), 4(B) and 4(C) are illustrations of a TFT according to a conventional example.
Figure 4B:
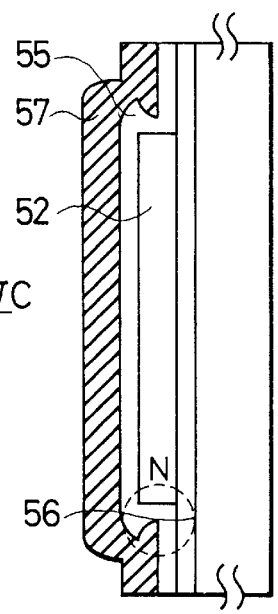
Figure 4C:
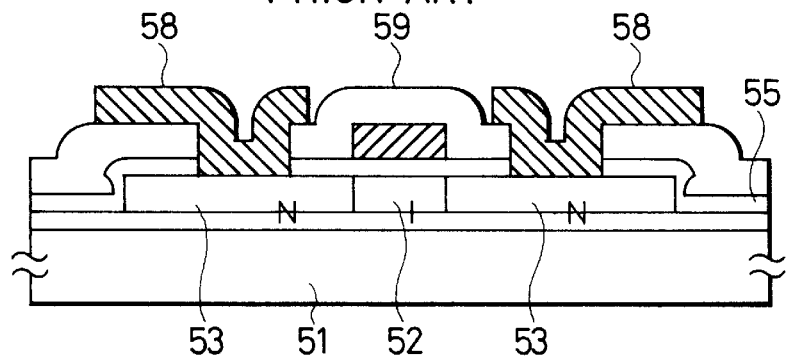

FIGS. 2(A) to 2(E) are sectional views of a serial process for carrying out a first embodiment. In the drawings of the following embodiments, only the sectional view of a TFT is shown, and the right side of each drawing shows a section (corresponding to sections 1A—1A and IVB—IVB of FIGS. 1(A) and 4(A) perpendicular to a gate electrode and the left side of each drawing shows a section (corresponding to sections IB—IB and IVC—IVC in FIGS. 1(A) and 4(A) parallel to the gate electrode.

Figure 2A:
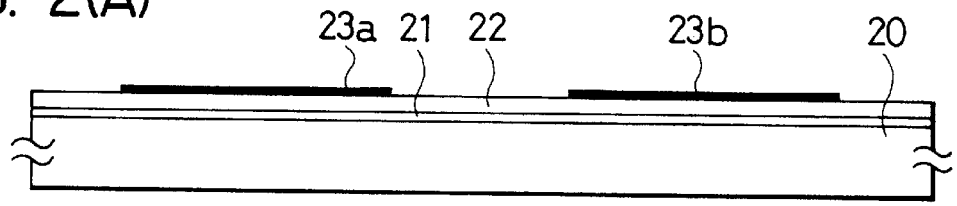
FIGS. 2(A) to 2(E) are sectional views of a serial process for carrying out a first embodiment.

First, a prime film 21 made of silicon oxide with the thickness of 2000 Å was formed on a substrate 20 (Corning 7059) by a sputtering. Further, an amorphous silicon film 22 with the thickness of 500 to 1500 Å(for example,1500 Å) was deposited by a plasma CVD method. Successively, a nickel silicide film (chemical formula $NiSi_x$, $0.4 \leq x \leq 2.5$, for example, x=2.0) with the thickness of 5 to 200 Å(for example, 200 Å) is deposited by the sputtering method, and a patterning was performed by a photolithography, and regions 23a and 23b were formed as shown in FIG. 2(A).

Figure 2B:
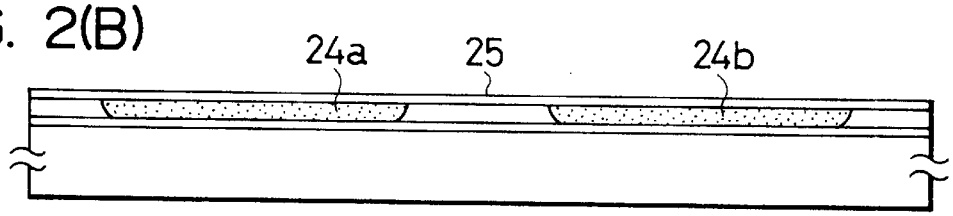

Next, the regions were annealed under a reducing atmosphere at 500° C. for 4 hours and were crystallized. As a result, the crystallized regions 24a and 24b were selectively formed. Then, a silicon oxide film 25 with the thickness of 1000 Å was deposited as a gate insulating film by the sputtering method as shown in FIG. 2(B).

Successively, a silicon film (containing 0.1 to 2% of phosphorus) with the thickness of 6000 to 8000 Å(for example, 6000 Å) was deposited by a low pressure CVD method. In this case, a process of forming the silicon oxide film and the silicon film is preferably performed in sequence. Then, the silicon film was patterned, and wirings 26a and 26b were formed. These wirings serve as a gate electrode.

Figure 2C:
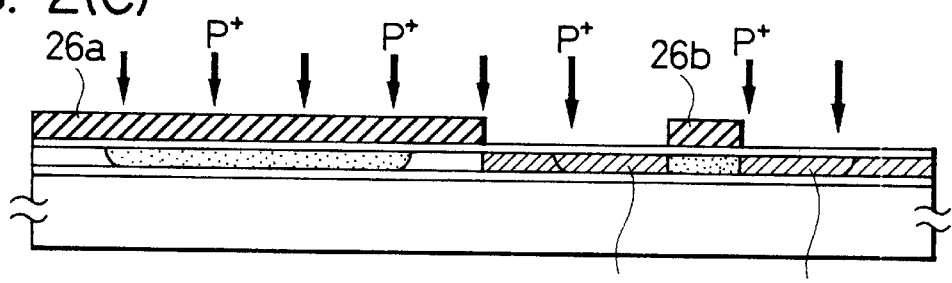

Further, by a plasma doping method, an impurity (phosphorus) was implanted into the silicon region using the wiring 26b as a mask. Phosphine ($PH_3$) was used as a doping gas and an accelerating voltage was 60 to 90 kV (for example, 80 kV) and the dose was $1 \times 10^{15}$ to $8 \times 10^{15}$ cm$^{-2}$ (for example, $5 \times 10^{15}$ cm$^{-2}$) as shown in FIG. 2(C).

Figure 2D:
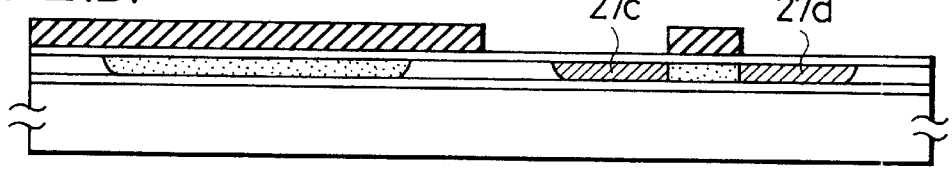

After this, by an annealing under the reducing atmosphere at 500° C. for 4 hours, the impurity was activated. Since the nickel was diffused in the regions 24a and 24b crystallized previously, a recrystallization easily proceeded by the annealing, and impurity regions 27a and 27b were formed. On the other hand, since there was no nickel in the regions uncrystallized previously, the crystallization did not proceed at this temperature and a remarkably high resistance was exhibited, although there was the doping impurity (phosphorus) as shown in FIG. 2(D).

Figure 2E:
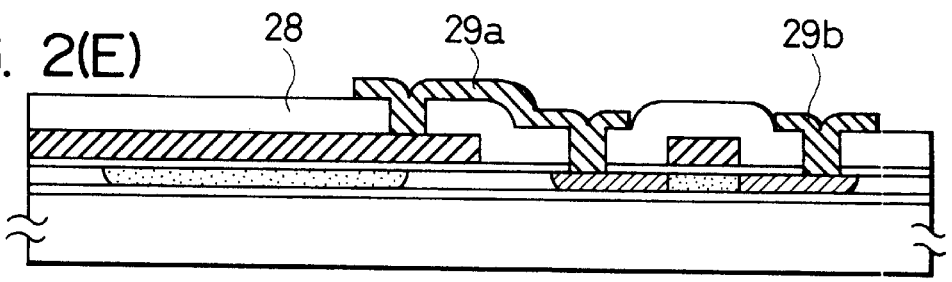

Then, a silicon oxide film 28 with the thickness of 6000 Å was formed as an interlayer insulator by the plasma CVD method, and contact holes were formed in the silicon oxide film 28, and wirings 29a and 29b were formed by a metal material such as a multilayered film of titanium nitride and aluminum. The wiring 29a connects the wiring 26a to the impurity region 27a of the TFT. By the above process, a semiconductor circuit was completed as shown in FIG. 2(E).

Embodiment 2

Figure 3A:
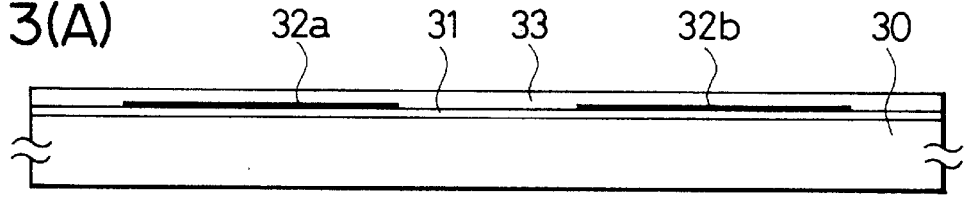
FIGS. 3(A) to 3(E) are sectional views of a serial process for carrying out a second embodiment.

FIGS. 3(A) to 3(E) are sectional views of a serial process for carrying out a second embodiment. A prime film 31 made of silicon oxide with the thickness of 2000 Å was formed on a substrate 30 (Corning 7059) by a sputtering. Further, a nickel film with the thickness of 5 to 200 Å(for example,10 Å) was deposited by an electron beam evaporation method, and a patterning was performed by a photolithography, and regions 32a and 32b were formed. Then, an amorphous silicon film with the thickness of 500 to 1500 Å(for example, 500 Å) was deposited by a plasma CVD method as shown in FIG. 3(A).

Figure 3B:
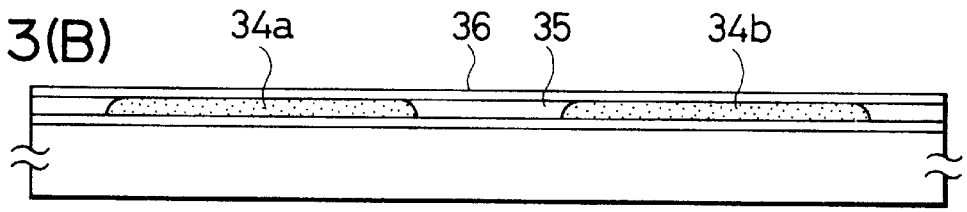

Next, the silicon film was annealed under a reducing atmosphere at 480° C. for 8 hours and was crystallized. By this crystallization process, the crystallized regions 34a and 34b could be formed. On the other hand, the region in the absence of the nickel was not crystallized at this temperature and was separated as an amorphous region 35 from the crystallized regions 34a and 34b. Then, the nickel silicide precipitated on the surface was removed by treating the film with 5 to 30% of hydrochloric acid. A silicon oxide film 36 with the thickness of 1000 Å was deposited as a gate insulating film by the sputtering method as shown in FIG. 3(B).

Successively, an aluminum film (containing 2% of silicon) with the thickness of 6000 to 8000 Å(for example, 6000 Å) was deposited by the sputtering method. In this case, a process of forming the silicon oxide film 36 and the aluminum film is preferably performed in sequence. Then, the aluminum film was patterned, and wirings 37a and 37b were formed. These wirings serve as a gate electrode. Further, the surface of the aluminum wiring was anodized, and oxide layers 38a and 38b were formed on the surface. Before the anodization, a polyimide mask was selectively formed on a part in which a contact hole will be later formed by a Photoneece. During the anodization, an anodized oxide was not formed due to the mask.

Figure 3C:
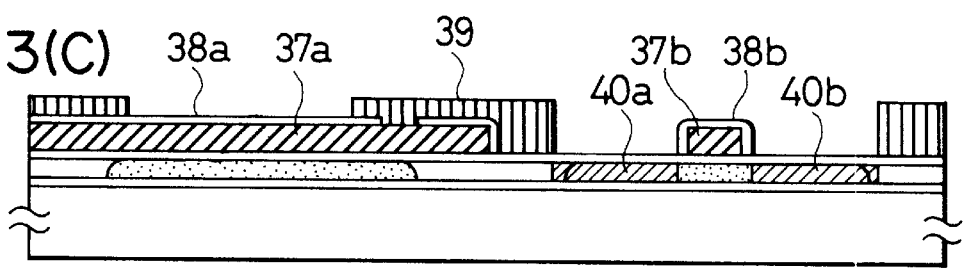

The anodization was performed in 1 to 5 % of ethylene glycol solution of tartaric acid. The thickness of the obtained oxide layers was 2000 Å. Next, a mask 39 of polyimide was formed by the well-known photolithography using the Photoneece. Then, using the mask, an impurity (phosphorus) was selectively implanted into the silicon region by a plasma doping method. Phosphine ($PH_3$) was used as a doping gas and an accelerating voltage was 60 to 90 kV (for example, 80 KV) and the dose was $1\times10^{15}$ to $8\times10^{15}$ $cm^{-2}$ (for example, $5\times10^{15}$ $cm^{-2}$). In this manner, N-type impurity regions 40a and 40b were formed as shown in FIG. 3(C).

After this, the impurity was activated by a laser annealing method. While a KrF excimer laser (wavelength of 248 nm, pulse width of 20 nsec) was used, other lasers such as XeF excimer laser (wavelength of 353 nm), XeCl excimer laser (wavelength of 308 nm) and ArF excimer laser (wavelength of 193 nm) may be also employed. The energy density of the laser was 200 to 350 $mJ/cm^2$ (for example, 250 $mJ/cm^2$) and 2 to 10 shots per spot (for example, 2 shots) were emitted. During emitting the laser bean, the substrate may be heated to about 200 to 450° C. When the substrate is heated, notice must be taken of the change in the most suitable laser energy density. During emitting the laser beam, the polyimide mask 39 was left. Because of this, the exposed aluminum is damaged by the emitted laser beam and further the region not to be crystallized (for example, region 35 between the TFTs) must be prevented from being crystallized by the emitted laser beam. After emitting the laser beam, the polyimide mask 39 can be easily removed by exposing it in an oxygen plasma.

Figure 3D:
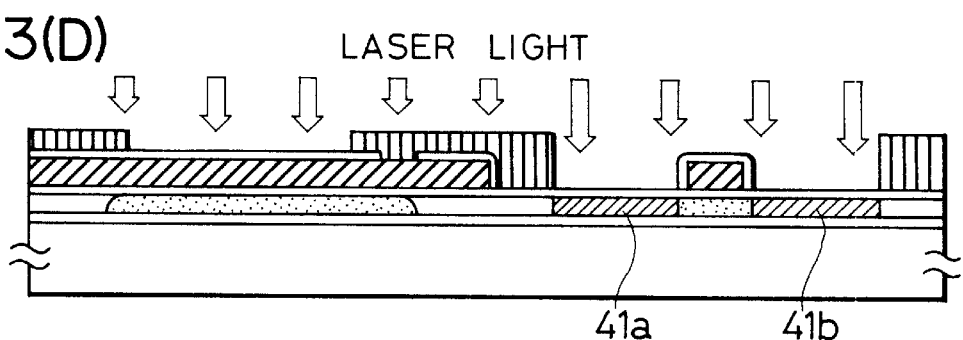

As a result, impurity regions 41a and 41b were formed as shown in FIG. 3(D).

Figure 3E:
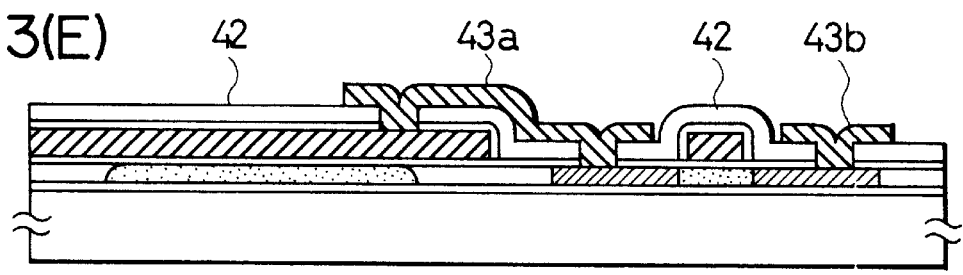

Then, a silicon oxide film 42 with the thickness of 2000 Å was formed as an interlayer insulator by the plasma CVD method, and contact holes were formed in the silicon oxide film 42, and wirings 43a and 43b were formed by a metal material such as a multilayered film of titanium nitride and aluminum. The wiring 43a connects the wiring 37a to the impurity region 41a of the TFT. By the above process, a semiconductor circuit was completed as shown in FIG. 3(E).

In the process as stated above, the semiconductor circuit was completed and the resulted TFT characteristics were not inferior to the conventional TFT characteristics at all. For example, it has been proved that a shift register manufactured by the present embodiments is operated at 11 MHz (drain voltage of 15 V) and 16 MHz (drain voltage of 17 V). Further, the yield of the present TFT was improved up to 80% or more while the yield of the conventional TFT was 20% or less.

By the present invention, the yield of the TFT can be improved and the reliability can be increased. While the present invention has been described by way of example of an N channel type TFT, it will be understood that various changes and modifications such as a P channel type TFT or a complementary circuit in which the N channel type and the P channel type are mixed on the same substrate may be made similarly. As described above, the present invention shall benefit over all industrial fields.

What is claimed is:

1. A method for producing a semiconductor device comprising the steps of:

forming a base film on a substrate;

forming a semiconductor film comprising silicon on the base film;

selectively forming a material comprising at least one element selected from the group consisting of nickel, iron, cobalt and platinum in contact with the semiconductor film; and annealing the semiconductor film by heating in a reducing atmosphere to crystallize it using the element after said selectively forming step;

wherein a portion of the semiconductor film is not crystallized by the annealing step and insulates from crystallized portions of the semiconductor film each other.

2. The method of claim 1 wherein said annealing step is carried out at a temperature of 400° to 580° C.

3. The method of claim 1 wherein the base film is formed on the substrate by sputtering.

4. A method for producing a semiconductor device comprising the steps of:

forming a semiconductor film comprising silicon on a substrate;

forming a material comprising at least one element selected from the group consisting of nickel, iron, cobalt and platinum in contact with the semiconductor film; and heating the semiconductor film in a reducing atmosphere to crystallize it using the element, wherein a portion of the semiconductor film is not crystallized by the heating step and insulates from crystallized portions of the semiconductor film each other.

5. A method for producing a semiconductor device comprising the steps of:

forming a base film on a substrate by sputtering;

forming a semiconductor film comprising silicon on the base film;

selectively forming a material comprising at least one element selected from the group consisting of nickel, iron, cobalt and platinum in contact with the semiconductor film; and heating the semiconductor film to crystallize it using the element, wherein a portion of the semiconductor film is not crystallized by the heating step and insulates from crystallized portions of the semiconductor film each other.

* * * * *